(12) United States Patent
Liao et al.

(10) Patent No.: US 9,236,497 B2
(45) Date of Patent: Jan. 12, 2016

(54) METHODS FOR FABRICATING SEMICONDUCTOR DEVICE

(71) Applicant: MACRONIX International Co., Ltd., Hsinchu (TW)

(72) Inventors: Jeng-Hwa Liao, Hsinchu (TW); Jung-Yu Shieh, Hsinchu (TW); Ling-Wuu Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 25 days.

(21) Appl. No.: 14/107,935

(22) Filed: Dec. 16, 2013

(65) Prior Publication Data

US 2015/0171223 A1 Jun. 18, 2015

(51) Int. Cl.

| | |
|---|---|
| *H01L 27/108* | (2006.01) |
| *H01L 29/76* | (2006.01) |
| *H01L 29/94* | (2006.01) |
| *H01L 31/119* | (2006.01) |
| *H01L 29/788* | (2006.01) |
| *H01L 21/02* | (2006.01) |
| *H01L 21/762* | (2006.01) |
| *H01L 21/3105* | (2006.01) |
| *H01L 21/311* | (2006.01) |
| *H01L 29/423* | (2006.01) |
| *H01L 21/3215* | (2006.01) |
| *H01L 21/265* | (2006.01) |

(52) U.S. Cl.
CPC ........ *H01L 29/7883* (2013.01); *H01L 21/0262* (2013.01); *H01L 21/02164* (2013.01); *H01L 21/02238* (2013.01); *H01L 21/02252* (2013.01); *H01L 21/02573* (2013.01); *H01L 21/31053* (2013.01); *H01L 21/31055* (2013.01); *H01L 21/31111* (2013.01); *H01L 21/3215* (2013.01); *H01L 21/32155* (2013.01); *H01L 21/76224* (2013.01); *H01L 29/42324* (2013.01); *H01L 29/42376* (2013.01); *H01L 21/26586* (2013.01); *H01L 21/26593* (2013.01)

(58) Field of Classification Search
CPC ............. H01L 21/041; H01L 21/0257; H01L 21/0455; H01L 21/265; H01L 21/31658; H01L 21/8239; H01L 21/28194; H01L 21/0228; H01L 21/76229; H01L 21/76205; H01L 21/76202; H01L 21/76224; H01L 29/24
USPC ......... 257/296, 315, 318, 320, 335, 336, 410, 257/411, 412, 506, 507, 607, 396, 701, 760, 257/E21.006, E21.009, E21.042, E21.043, 257/E21.056, E21.057, E21.058, E21.059, 257/E21.077, E21.17, E21.126, E21.127, 257/E21.147, E21.248, E21.253
See application file for complete search history.

(56) References Cited

U.S. PATENT DOCUMENTS

| 5,543,339 A * | 8/1996 | Roth et al. ..................... 438/265 |
| 6,166,409 A * | 12/2000 | Ratnam et al. ................ 257/316 |
| 8,097,911 B2 * | 1/2012 | Keller ........................... 257/316 |
| 2012/0261739 A1 * | 10/2012 | Yang et al. .................... 257/316 |

* cited by examiner

*Primary Examiner* — David Nhu
(74) *Attorney, Agent, or Firm* — J.C. Patents (57) ABSTRACT

The method for fabricating a semiconductor device is provided. A doped semiconductor layer is formed over the substrate. The doped semiconductor layer is patterned to form a plurality of doped semiconductor patterns. An implantation process is performed to implant a dopant into the doped semiconductor patterns. A process temperature of the implantation process is no more than about −50° C. The dopants of the implantation process and the doped semiconductor patterns have the same conductivity type.

3 Claims, 7 Drawing Sheets

METHODS FOR FABRICATING SEMICONDUCTOR DEVICE

BACKGROUND OF THE INVENTION

1. Field of the Invention

The present invention relates to a method for fabricating a semiconductor device, and in particular, to a method for fabricating a non-volatile memory.

2. Description of Related Art

A non-volatile memory is able to retain the stored data even when the electrical power is off. As a result, many electronic products have such memories to provide normal operations when booted. In particular, a flash memory allows multiple data writing, reading, and erasing operations. With these advantages, the flash memory has become one of the most widely adopted memory devices in personal computers and electronic equipments.

The floating gate of the flash memory is usually formed of a polysilicon layer by a chemical vapor deposition (CVD) process with in situ doping. However, the dopant loss of the floating gate occurs during the high-temperature subsequent processes. As a result, the conductivity of the floating gate is reduced and thus leading depletion issue, reliability issue, programming/erase distribution issue, or endurance issue.

SUMMARY OF THE INVENTION

Accordingly, the present invention is directed to a method for fabricating a semiconductor device, in which the dopant loss of the floating gate is compensated by a low-temperature implantation process, so that the required conductivity of the floating gate can be maintained and therefore the performance of the device can be improved.

The prevent invention provides a method for fabricating a semiconductor device. A first doped semiconductor layer is formed over a substrate. The first doped semiconductor layer is patterned to form a plurality of first doped semiconductor patterns. An implantation process is performed to implant a dopant into the first doped semiconductor patterns, wherein a process temperature of the implantation process is no more than about −50° C., and the dopant of the implantation process and the first doped semiconductor patterns have the same conductivity type.

According to an embodiment of the present invention, the implantation process comprises an ion implantation process or a plasma ion implantation process.

According to an embodiment of the present invention, the implantation process comprises a tilted ion implantation process.

According to an embodiment of the present invention, the tilted ion implantation process is performed with a tilt angle of about 20° to 60°.

According to an embodiment of the present invention, the substrate is rotated at least once by about 90 degrees, 180 degrees or 270 degrees during the implantation process.

According to an embodiment of the present invention, the process temperature of the implantation process is within a range of about −133° C. to −50° C.

According to an embodiment of the present invention, the method further includes, before performing the implantation process, forming a plurality of screen layers respectively covering the first doped semiconductor patterns.

According to an embodiment of the present invention, each screen layer comprises silicon oxide layer.

According to an embodiment of the present invention, each screen layer is formed by a plasma oxidation process or an in-situ-steam-generation (ISSG) oxidation process.

According to an embodiment of the present invention, the method further includes, before performing the implantation process, forming two trenches in the substrate beside each first doped semiconductor pattern; and forming an isolation layer in the trenches to expose a top surface and a sidewall of each first doped semiconductor patter.

According to an embodiment of the present invention, the step of forming the isolation layer includes forming an insulation layer filling the trench and covering the top surface and the sidewall of each first doped semiconductor pattern; performing a chemical-mechanical polishing process to remove a portion of the insulation layer; and etching back the insulation layer to expose the top surface and the sidewall of each first doped semiconductor pattern.

According to an embodiment of the present invention, the method further includes, before forming the doped semiconductor layer, forming a gate dielectric layer on the substrate.

According to an embodiment of the present invention, the method further includes, forming the dielectric layer on the first doped semiconductor patterns; and forming a second doped semiconductor layer on the dielectric layer.

According to an embodiment of the present invention, the method further includes removing the screen layers with a cleaning process before forming the dielectric layer.

According to an embodiment of the present invention, the first doped semiconductor layer comprises a doped polysilicon layer or a doped semiconductor compound layer.

According to an embodiment of the present invention, the first doped semiconductor layer is formed by a CVD process with in-situ doping.

According to an embodiment of the present invention, the dopant is an n-type dopant or a p-type dopant.

The prevent invention also provides a method for fabricating a semiconductor device. A first doped semiconductor layer is formed over a substrate. The first doped semiconductor layer is patterned to form a plurality of first doped semiconductor patterns. A plurality of screen layers is formed respectively covering the first doped semiconductor patterns. An implantation process is performed to implant a dopant into the first doped semiconductor patterns, wherein the dopants of the implantation process and the first doped semiconductor patterns have the same conductivity type.

According to an embodiment of the present invention, each screen layer comprises silicon oxide layer.

According to an embodiment of the present invention, each screen layer is formed by a plasma oxidation process or an in-situ-steam-generation oxidation process.

In summary, in the method of the present invention, the dopant loss of the floating gate can be compensated by a low-temperature implantation process, so that the required conductivity of the floating gate can be maintained and therefore the performance of the device can be improved.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIG. 1A through FIG. 1F are schematic cross-sectional views showing a method for fabricating a non-volatile memory.

Figure 1A:
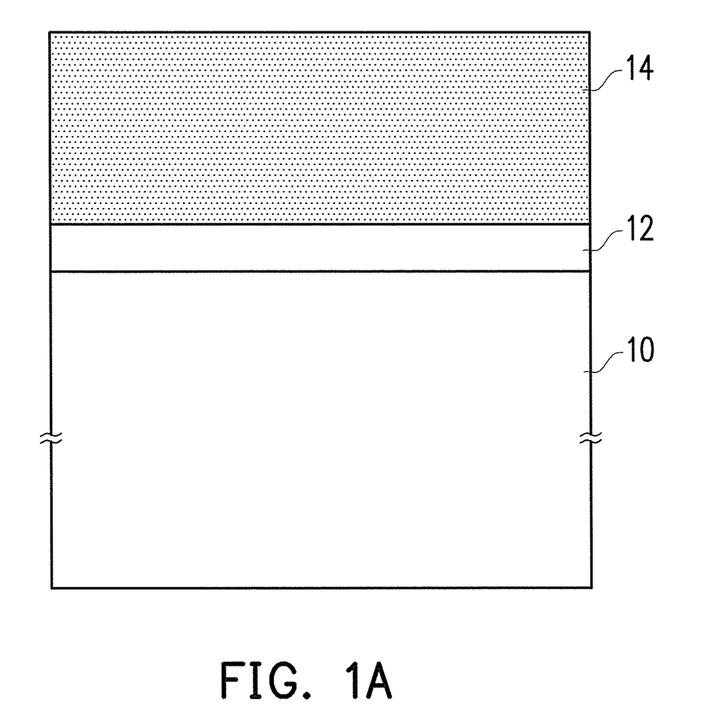
FIG. 1A through FIG. 1F are schematic cross-sectional views showing a method for fabricating a non-volatile memory.

Referring to FIG. 1A, a gate dielectric layer 12 is formed on a substrate 10. The substrate 10, for example, is a semiconductor substrate such as an N-type or a P-type silicon substrate, group III-V semiconductor substrate, or the like. The gate dielectric layer 12 includes, for example, silicon oxide or a high dielectric constant (high-k) material layer. The material of the high dielectric constant material layer is, for example, a dielectric material with a dielectric constant greater than 4, such as $TiO_2$, $HfO_2$, $ZrO_2$, $Al_2O_3$, $La_2O_3$, $Y_2O_3$, $Gd_2O_3$, $Ta_2O_5$, or combinations thereof. The gate dielectric layer 12 may be fabricated by a chemical vapor deposition (CVD) process, for instance. Thereafter, a doped semiconductor layer 14 is formed on the gate dielectric layer 12. The doped semiconductor layer 14 includes a doped polycrystalline silicon (polysilicon) layer or a doped semiconductor compound layer such as SiGe or SiP. The doped semiconductor layer 14 may be formed by a CVD process with in-situ doping. The dopant of the doped semiconductor layer 14 may be an n-type dopant or a p-type dopant. The N-type dopant is phosphorus (P) or arsenic (As), and the P-type dopant is, boron (B), for example.

Figure 1B:
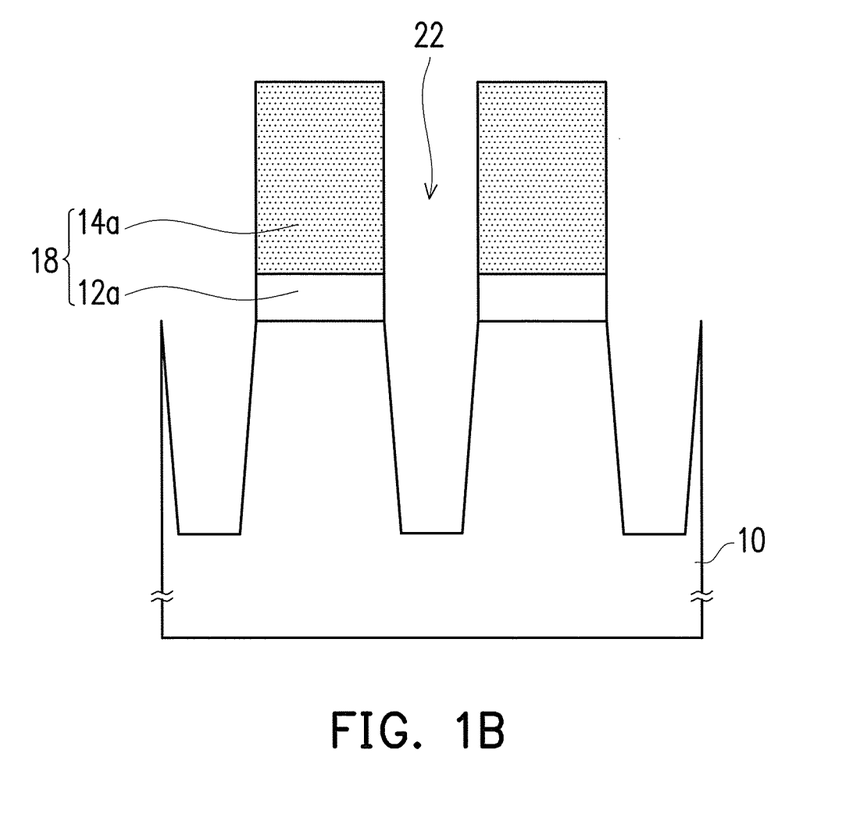

Referring to FIG. 1B, the doped semiconductor layer 14 and the gate dielectric layer 12 may be patterned to form a plurality of gate structures 18 by a lithography process and an etching process, for example. Each of the gate structures 18 includes a gate dielectric pattern 12a and a doped semiconductor pattern 14a. Next, an isotropic etching process is performed to the substrate 10, using the gate dielectric patterns 12a and doped semiconductor patterns 14a as a mask, so as to form two trenches 22 in the substrate 10 beside each gate structure 18.

Figure 1C:
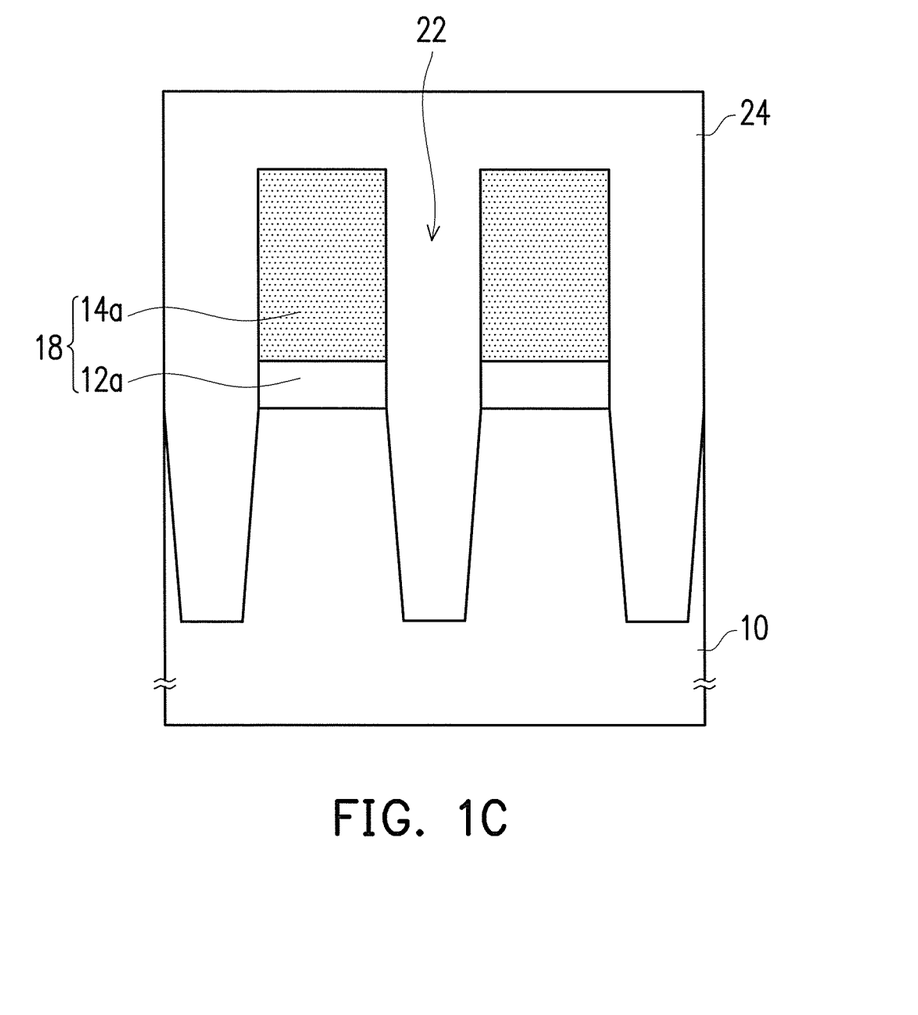

Thereafter, referring to FIG. 1C, an insulation layer 24 is formed over the substrate 10 filling the trenches 22 and covering the top surface and the sidewall of each doped semiconductor pattern 14a. The insulation layer 24 is formed of a silicon oxide layer by a high density plasma chemical vapor deposition process, for example.

Figure 1D:
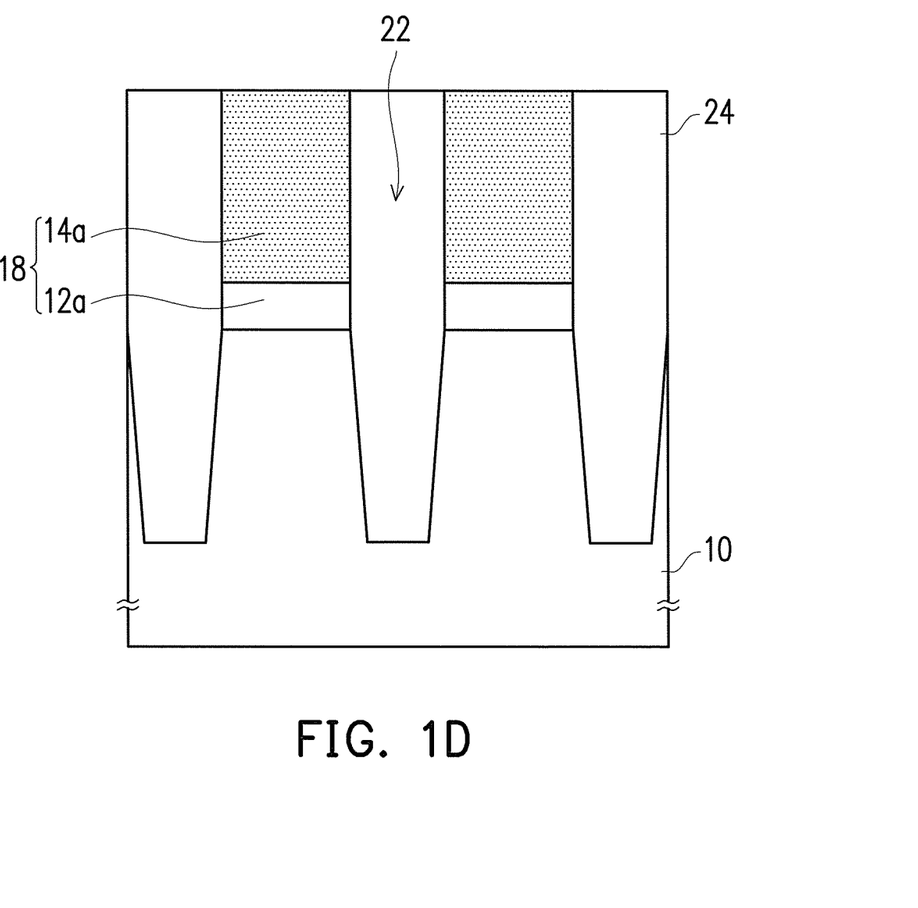

Referring to FIG. 1D, a chemical-mechanical polishing process is performed on the insulation layer 24 by using the doped semiconductor patterns 14a as a polishing stop layer.

Figure 1E:
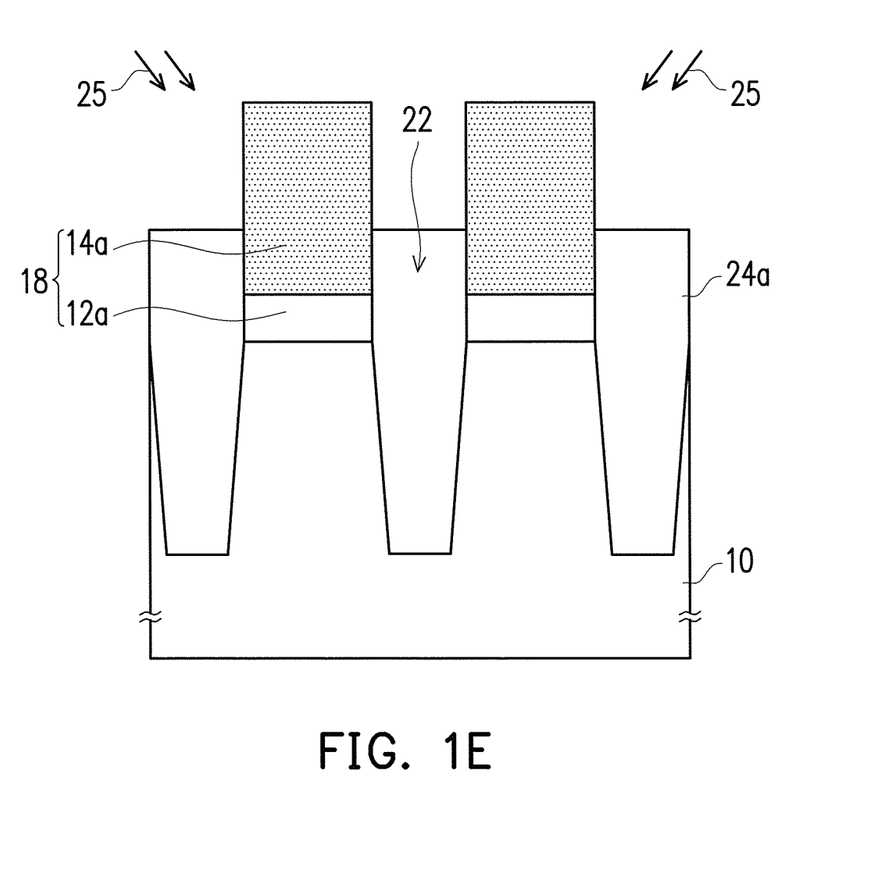

Referring to FIG. 1E, the insulation layer 24 is etched back so as to form an isolation layer 24a. The isolation layer 24a exposes the top surface and the sidewall of each doped semiconductor pattern 14a.

Thereafter, an implantation process 25 is performed on the doped semiconductor patterns 14a to implant a dopant thereinto, so as to compensate the dopant loss during the previous steps after forming the doped semiconductor layer 14. The dopant may be an n-type dopant or a p-type dopant. The N-type dopant is phosphorus (P) or arsenic (As), and the P-type dopant is boron (B), for example. Besides, the dopant of the implantation process 25 and the doped semiconductor patterns 14a have the same conductivity type.

A process temperature of the implantation process 25 is no more than about −50° C. In an embodiment, the process temperature of the implantation process 25 is within a range of about −133° C. to −50° C. Further, the substrate 10 is rotated at least once by about 90 degrees, 180 degrees or 270 degrees during the implantation process 25. In an embodiment, during the implantation process 25, the substrate 10 is rotated four times by 90 degrees per rotation. Since the process temperature of the implantation process 25 is performed at a low temperature, the deformation of the doped semiconductor patterns 14a due to high process temperature is not observed. The implantation process 25 may include an ion implantation process or a plasma ion implantation process. The ion implantation process is, for example, a tilted ion implantation process with a tilt angle of about 20° to 60°, an energy of about 5 and 50 KeV, and a does of about $5 \times 10^{13}$ and $5 \times 10^{15}$ atom/$cm^2$. Herein, the tilt angle is the angle between the ion beam and the normal to the substrate surface. Besides, such tilted ion implantation process does not cause any height loss of the doped semiconductor patterns 14a.

Figure 1F:
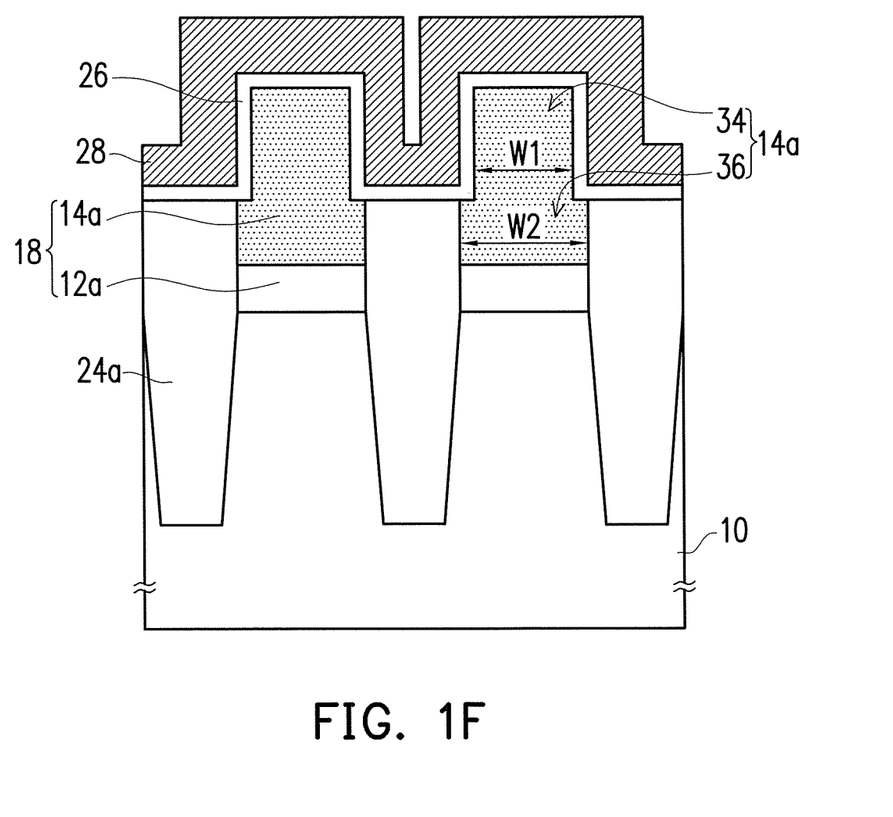

Referring to FIG. 1F, a dielectric layer 26 is formed over the substrate 10 covering the top surface and the sidewall of each doped semiconductor pattern 14a. The dielectric layer 26 includes a dielectric material, such as silicon oxide, silicon oxynitride, silicon nitride, a high-k dielectric material, other suitable dielectric material, or combinations thereof. The exemplary high-k dielectric material includes $TiO_2$, $HfO_2$, $ZrO_2$, $Al_2O_3$, $La_2O_3$, $Y_2O_3$, $Gd_2O_3$, $Ta_2O_5$, a suitable material, or a combination thereof. The dielectric layer 26 may include a multilayer structure. For example, the dielectric layer 26 may include silicon oxide, silicon nitride, and silicon oxide, form the bottom up. Thereafter, a doped semiconductor layer 28 is formed over the dielectric layer 26. In the present embodiment, the doped semiconductor layer 28 is a polycrystalline silicon (polysilicon) layer. The polysilicon layer may be doped for proper conductivity. Thereafter, the doped semiconductor layer 28 and the dielectric layer 26 are patterned by a lithography process and etching process.

In an embodiment, each doped semiconductor pattern 14a and the patterned doped semiconductor layer 28 thereon may respectively serve as a reverse T-shaped floating gate and a control gate of a flash memory cell. The gate dielectric pattern 12a under doped semiconductor pattern 14a, and the dielectric layer 26 between the doped semiconductor pattern 14a and the patterned doped semiconductor layer 28 may respectively serve as a tunneling dielectric layer and an inter-gate dielectric layer of the flash memory cell. More specifically, each doped semiconductor pattern 14a is a reverse T-shape. Each doped semiconductor pattern 14a includes a top portion 34 having a first width W1 and a bottom portion 36 having a second width W2, and the first width W1 is smaller than the second width W2. In an embodiment, the second width W2 is larger than the first width W1 by about 10 to about 15 Å. A top surface and a sidewall of the top portion 34 and a top surface (exposed by the top portion 34) of the bottom portion 36 of the doped semiconductor pattern 14a are covered by the dielectric layer 26, and a sidewall of the bottom portion 36 of the doped semiconductor pattern 14a is covered by the isolation layer 24a.

Figure 2:
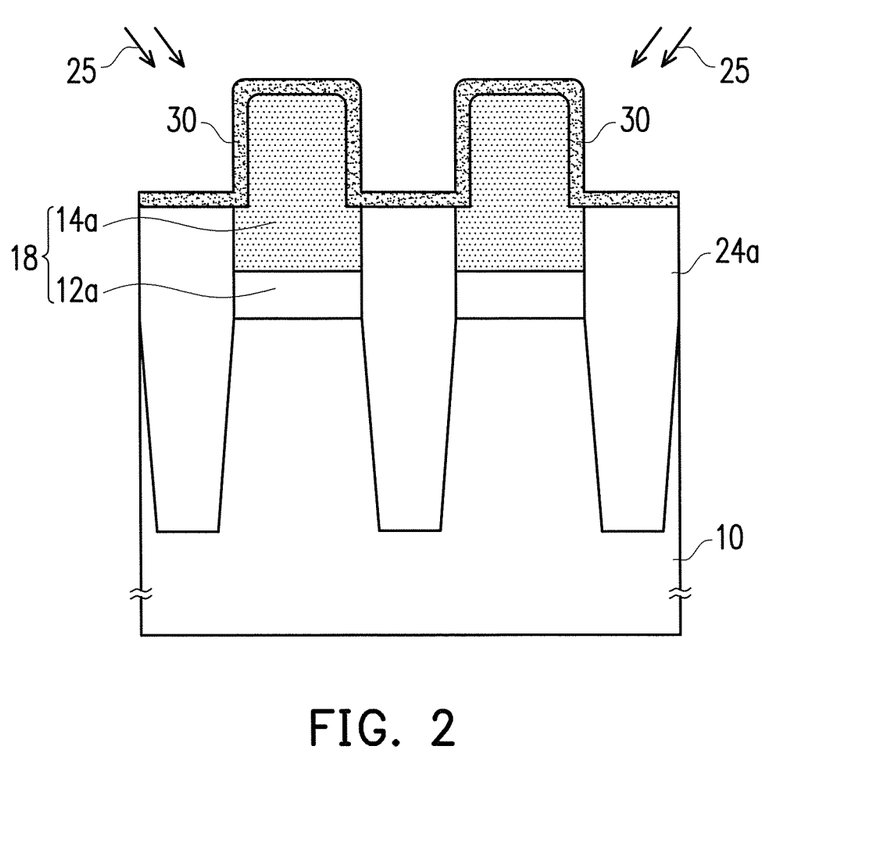
FIG. 2 is schematic cross-sectional view showing a step of a method for fabricating a non-volatile memory.

FIG. 2 is schematic cross-sectional view showing a step of a method for fabricating a non-volatile memory.

Referring to FIG. 2, in addition, before performing the implantation process 25 to the doped semiconductor patterns 14a, a screen layer 30 may be formed on the top surface and the sidewall of each doped semiconductor pattern 14a. Each screen layer 30 includes silicon oxide layer. The method of forming the screen layers includes, for example, performing a plasma oxidation process or an in-situ-steam-generation (ISSG) oxidation process. Each screen layer 30 may has a thickness of 10 angstroms to 30 angstroms. Herein, each screen layer 30 is formed on the corresponding doped semiconductor pattern 14a, so that implant damage to the doped semiconductor patterns 14a can be effectively reduced. Further, the screen layers 30 may be formed to round the top corners of the doped semiconductor patterns 14a. In such case, the doped semiconductor layer 28 can easily fill in gaps between the doped semiconductor patterns 14a due to the rounding corners. Since the screen layers 30 are very thin, they may be easily removed during the cleaning process before the dielectric layer 26 is formed (as shown in FIG. 1E). Herein, no additional etching step for removing the screen layers 30 is required and therefore no additional process cost is required. Besides, such cleaning process would not cause any damage to the isolation layer 24a.

The non-volatile memory fabricated according to the foregoing embodiments includes doped semiconductor patterns as floating gates. The dopant loss of each floating gate can be compensated by a low-temperature implantation process, so that the required conductivity of the floating gate can be maintained and therefore the performance of the device (e.g. reliability, programming/erase distribution or endurance) can be improved. Further, the implantation process is performed at a lower temperature, so that the deformation (e.g. bending or tilting) of the floating gates due to high process temperature is not observed. In addition, the tilted ion implantation process of the invention does not cause any height loss of the floating gates. Furthermore, before the implantation process is performed to the floating gates, a screen layer is formed on a top surface and a sidewall of each floating gate, so that implant damage to the floating gates can be effectively reduced.

The above process of fabricating a non-volatile memory is used to exemplify an embodiment of the present invention, but the present invention is not limited thereto. The present invention can be applied to various processes of fabricating a semiconductor device including a doped semiconductor layer having dopant loss during various processes.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory cell, comprising:
   a substrate;
   a tunneling dielectric layer on the substrate;
   a reverse T-shaped floating gate on the tunneling dielectric layer;
   a control gate on the reverse T-shaped floating gate; and
   an inter-gate dielectric layer between the reverse T-shaped floating gate and the control gate,
   wherein the reverse T-shaped floating gate comprises a top portion having a first width and a bottom portion having a second width, and the first width is smaller than the second width.

2. The non-volatile memory cell according to claim 1, wherein the second width is larger than the first width by about 10 Å to about 15 Å.

3. The non-volatile memory cell according to claim 1, wherein a top surface and a sidewall of the top portion and a top surface of the bottom portion of the reverse T-shaped floating gate are covered by the inter-gate dielectric layer, and a sidewall of the bottom portion of the reverse T-shaped floating gate is covered by an isolation layer.

* * * * *